United States Patent
Ek et al.

(10) Patent No.: US 9,911,935 B2
(45) Date of Patent: Mar. 6, 2018

(54) TRANSPARENT CONDUCTING OXIDE AS TOP-ELECTRODE IN PEROVSKITE SOLAR CELL BY NON-SPUTTERING PROCESS

(71) Applicant: International Business Machines Corporation, Armonk, NY (US)

(72) Inventors: Bruce A. Ek, Pelham Manor, NY (US); Talia S. Gershon, White Plains, NY (US); Supratik Guha, Chappaqua, NY (US); Oki Gunawan, Fair Lawn, NJ (US); Teodor K. Todorov, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 30 days.

(21) Appl. No.: 14/846,119

(22) Filed: Sep. 4, 2015

(65) Prior Publication Data

US 2017/0069861 A1    Mar. 9, 2017

(51) Int. Cl.
*H01L 51/44*   (2006.01)
*H01L 51/00*   (2006.01)
*H01L 31/032*   (2006.01)
*H01L 31/0725*   (2012.01)
*H01L 51/42*   (2006.01)

(52) U.S. Cl.
CPC ........ *H01L 51/442* (2013.01); *H01L 31/0326* (2013.01); *H01L 31/0725* (2013.01); *H01L 51/0021* (2013.01); *H01L 51/4213* (2013.01); *Y02E 10/549* (2013.01)

(58) Field of Classification Search
None
See application file for complete search history.

(56) References Cited

U.S. PATENT DOCUMENTS

| | | | |
|---|---|---|---|
| 5,605,610 A | 2/1997 | Ishibashi | |
| 5,779,802 A | 7/1998 | Borghs et al. | |
| 6,153,271 A * | 11/2000 | Mearini | C23C 14/086 427/255.32 |
| 6,429,318 B1 | 8/2002 | Mitzi | |
| 6,743,488 B2 * | 6/2004 | Memarian | C23C 14/0036 257/E31.126 |
| 7,705,235 B2 | 4/2010 | Bilyalov et al. | |

(Continued)

OTHER PUBLICATIONS

R.F. Service, "Perovskite Solar Cells Keep on Surging," Science, vol. 344, No. 6183, p. 458 (May 2014).

(Continued)

*Primary Examiner* — Nathan T Leong
(74) *Attorney, Agent, or Firm* — Vazken Alexanian; Michael J. Chang, LLC

(57) ABSTRACT

Techniques for forming a transparent conducting oxide (TCO) top contact using a low temperature process are provided. In one aspect of the invention, a method of forming a TCO on a substrate is provided. The method includes the steps of: generating a source gas of the TCO using e-beam evaporation; generating atomic oxygen using RF plasma; and contacting the substrate with the TCO source gas and the atomic oxygen under conditions sufficient to form the TCO on the substrate. A photovoltaic device is also provided which includes a bottom cell; and a perovskite-based top cell on the kesterite-based bottom cell. The perovskite-based top cell includes a top electrode formed from a TCO.

18 Claims, 4 Drawing Sheets

(56) References Cited

U.S. PATENT DOCUMENTS

| | | | |
|---|---|---|---|
| 2005/0150542 A1* | 7/2005 | Madan | H01L 31/043 |
| | | | 136/255 |
| 2007/0281495 A1* | 12/2007 | Mallick | C23C 16/045 |
| | | | 438/778 |
| 2010/0326505 A1 | 12/2010 | Ryu et al. | |
| 2011/0005596 A1* | 1/2011 | Shin | C09B 57/007 |
| | | | 136/261 |
| 2012/0040485 A1* | 2/2012 | Schramm | C23C 14/16 |
| | | | 438/57 |
| 2014/0050908 A1 | 2/2014 | Nashiki et al. | |

OTHER PUBLICATIONS

J. George et al., "Electrical and optical properties of electron beam evaporated ITO thin films," Surface and Coatings Technology, vol. 132, No. 1, Oct. 2000, pp. 45-48.

M. Yamaguchi et al., "Characteristics of indium tin oxide thin films prepared using electron beam evaporation," Thin Solid Films, vol. 447, Jan. 2004, pp. 115-118.

H.R. Fallah et al., "The effect of annealing on structural, electrical and optical properties of nanostructured ITO films prepared by e-beam evaporation," Materials Research Bulletin, vol. 42, No. 3, 2007, pp. 487-496 (published Jul. 2006).

N.A. Simpson, "The Effect of Atomic Oxygen on the Formation of Indium Tin Oxide Thin Films." Masters Diss. Texas State University—San Marcos, Aug. 2013, 103 pages.

V.A. Sterligov et al., "Fabrication and properties of ITO films treated by excited atomic oxygen," Applied Optics, vol. 51, No. 12, Apr. 2012, pp. 1997-2003.

\* cited by examiner

TRANSPARENT CONDUCTING OXIDE AS TOP-ELECTRODE IN PEROVSKITE SOLAR CELL BY NON-SPUTTERING PROCESS

FIELD OF THE INVENTION

The present invention relates to transparent conducting oxide (TCO) for use as top electrode or contact in solar cells, and more particularly, to techniques for forming a TCO top contact in a perovskite solar cell using a low temperature, non-sputtering process.

BACKGROUND OF THE INVENTION

Metal-organic halide perovskites are promising absorber materials for photovoltaics. However, these materials are delicate and degrade under harsh processing conditions (such as sputtering).

Tandem (multi-junction) photovoltaic devices require a transparent electrode at the top of the device through which light may reach the various layers in the device. This transparent electrode is often a transparent conducting oxide (TCO). The primary method for preparing most TCOs is sputtering.

Thus, tandem devices containing delicate materials in the top junction will require a less-aggressive method for preparing the TCO than sputtering to avoid damage to the material.

SUMMARY OF THE INVENTION

The present invention provides techniques for forming a transparent conducting oxide (TCO) top contact using a low temperature, non-sputtering process. In one aspect of the invention, a method of forming a TCO on a substrate is provided. The method includes the steps of: generating a source gas of the TCO using electron-beam (e-beam) evaporation; generating atomic oxygen using radio frequency (RF) plasma; and contacting the substrate with the TCO source gas and the atomic oxygen under conditions sufficient to form the TCO on the substrate.

In another aspect of the invention, a photovoltaic device is provided. The photovoltaic device includes: a kesterite-based bottom cell; and a perovskite-based top cell on the kesterite-based bottom cell. The perovskite-based top cell includes a top electrode formed from a TCO.

A more complete understanding of the present invention, as well as further features and advantages of the present invention, will be obtained by reference to the following detailed description and drawings.

DETAILED DESCRIPTION OF PREFERRED EMBODIMENTS

As provided above, some high-efficiency absorber materials for photovoltaic devices, e.g., metal-organic halide perovskites, are delicate and degrade under harsh processing conditions—such as the high-temperature or atomic bombardment conditions employed during the sputtering based processes commonly employed to form transparent conducting oxide (TCO) top contact/electrodes in typical photovoltaic devices. Namely, any process to which these absorber materials are exposed that involves temperatures at, or exceeding, ~100° C. will damage the perovskite. Additionally, conditions of atomic bombardment by charged species will also damage the perovskite. Advantageously, provided herein are techniques for forming TCO contact/electrodes that do not involve sputtering and do not employ temperatures exceeding ambient room temperature (e.g., from about 20° C. to about 26° C., and ranges therebetween) or directly expose the perovskite to atomic bombardment. The terms "contact" and "electrode" will be used interchangeably herein.

Figure 1:
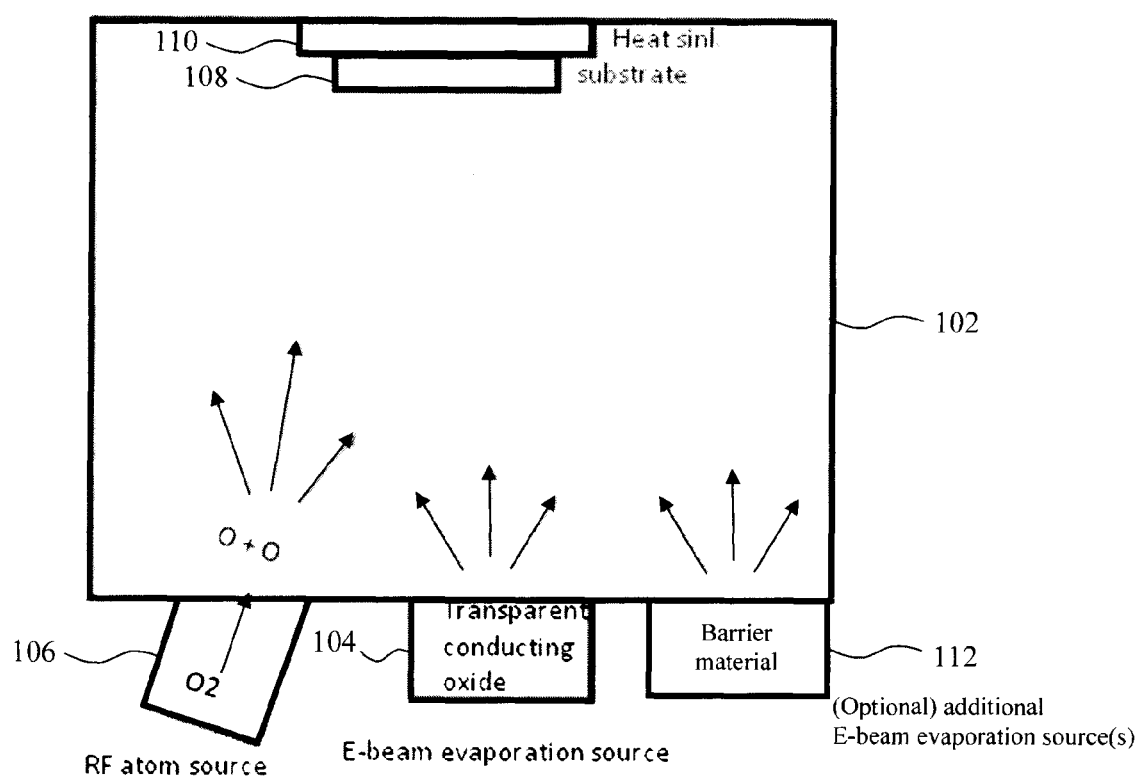
FIG. 1 is a diagram illustrating an exemplary apparatus for forming a transparent conductive oxide (TCO) top contact according to an embodiment of the present invention.

FIG. 1 is a diagram illustrating an exemplary apparatus 100 for forming a TCO top contact. Generally, the present techniques employ electron-beam (e-beam) evaporation of a TCO material along with a radio frequency (RF) plasma-based atomic oxygen generation process to control the oxygen content of the TCO. E-beam evaporation involves the heating and evaporation of a target anode (in this case a TCO evaporation source material) with an electron beam to transform atoms from the anode into the gaseous phase. These atoms will precipitate on surfaces within the vacuum chamber (including a target substrate) in line of sight of the anode—forming a layer of the anode material (e.g., TCO) on the target substrate, however many oxides will lose oxygen during this process to form an oxygen-poor film. Magnets may be used to direct the electron beam toward the target anode. An RF plasma-based atomic oxygen generation process employs RF power to generate a plasma (ionized gases) that is used to break down oxygen ($O_2$) into atomic oxygen free radicals (i.e., $O_2 \rightarrow O+O$) in a process referred to as "cracking." As will be described in detail below, according to one exemplary embodiment, the target substrate for the present e-beam evaporation and RF plasma-based atomic oxygen generation process is a perovskite-based solar cell. For instance, the target substrate might be a top (perovskite-based) solar cell in a tandem photovoltaic device on which a transparent top electrode is to be formed using the present techniques. See below.

More specifically, apparatus 100 includes a vacuum chamber 102, a TCO e-beam evaporation source 104 and an RF atomic oxygen source 106 within the vacuum chamber 102, and a target substrate 108 within the vacuum chamber 102 in line of sight of the TCO e-beam evaporation source 104 and the RF atomic oxygen source 106. By way of example only, as shown in FIG. 1, the TCO e-beam evaporation source 104 and the RF atomic oxygen source 106 can be located at one end of the vacuum chamber 102 (i.e., on one side of the vacuum chamber 102) and the target substrate 108 may be located at an opposite side of the vapor chamber (i.e., on a side of the vacuum chamber 102 opposite the TCO e-beam evaporation source 104 and the RF atomic oxygen source 106). Locating the TCO e-beam evaporation source 104/RF atomic oxygen source 106 and the target substrate 108 on opposite sides of the vacuum chamber 102 insures that they are in line of sight of one another.

As shown in FIG. 1, the TCO e-beam evaporation source 104 and RF atomic oxygen source 106 are located in pockets within the vacuum chamber 102. As will be described in detail below, embodiments are anticipated herein where e-beam evaporation alone is used to first form a barrier layer on the target substrate to protect the target substrate from the RF plasma. The barrier layer can be formed from the same TCO material as the top contact (although varying in oxygen content), or alternatively from a different material. In the latter case, it may be desirable to employ a multi-pocket e-beam evaporation system having one or more additional e-beam evaporation sources 112 within the vacuum chamber, e.g., as a source of the barrier layer material. That way the various layers of the TCO top contact can be formed (as described below) without braking vacuum in between deposition steps.

Optionally, the target substrate 108 is placed in thermal/physical contact with a heat sink 110. As provided above, it is important to avoid processing temperatures at or exceeding 100° C. in order to prevent damage to delicate absorber materials. Heat sink 110 can be used to remove any heat from the target substrate 108 generated during the deposition process. Suitable heat sinks include, but are not limited to, an aluminum or stainless steel block. Alternatively, active cooling of the target substrate can be carried out during deposition to maintain processing temperature at or below room temperature (e.g., at from about 10° C. to about 26° C., and ranges therebetween). This active cooling can be accomplished by flowing a cooling fluid (e.g., chilled water) through the heat sink using standard vacuum practices.

According to an exemplary embodiment, the TCO e-beam evaporation source 104 includes at least one TCO material selected from the group including, but not limited to, $In_2O_3$:Sn (indium-tin-oxide or ITO), $In_2O_3$:ZnO (indium-zinc-oxide or IZO), and titanium dioxide ($TiO_2$) which is placed in a crucible within the vacuum chamber 102. An e-beam focused on the crucible can evaporate these TCO source materials which will then precipitate on surfaces within the vacuum chamber 102 including the target substrate 108. The RF atomic oxygen source 106 may be oxygen ($O_2$) gas. According to an exemplary embodiment, the $O_2$ gas is present within an RF plasma source vessel configured to crack the $O_2$ into atomic oxygen free radicals. One suitable RF plasma source vessel is the UNI-Bulb RF Plasma Source for Oxygen available from Veeco, Plainview, N.Y. According to an exemplary embodiment, when present, the barrier material e-beam evaporation source 112 includes the same or a different TCO material from e-beam evaporation source 104. By way of example only, when e-beam evaporation source 104 includes ITO, the barrier material e-beam evaporation source 112 can include IZO or $TiO_2$, or vice versa. $TiO_2$ is suitable barrier material for the device since it is both electrically conductive and transparent.

Advantageously, the oxygen content in the resulting TCO material formed on the target substrate can be controlled in the current set-up via the RF atomic oxygen source 106. The oxygen content of the TCO material controls the transparency of the top contact being formed, as well as the conductivity. Without oxygen, defects are present in the material (which act as color centers) and the material would not be sufficiently transparent. Namely, as will be described in detail below, the oxygen content of the material can be controlled, via the RF atomic oxygen source 106, to achieve a desired optimal (e.g., about 90%) transparency. The oxygen concentration also controls the conductivity of the material. While high oxygen content results in higher transparency, the limit of stoichiometric oxygen concentration results in an insulating material. Therefore, the target material composition preferably contains enough oxygen to achieve high (e.g., about 90%) transparency while maintaining oxygen vacancies to allow for high conductivity. According to an exemplary embodiment, oxygen deficiency targets are on the order of from about 0.5% to about 5%, and ranges therebetween.

Oxygen deficiency is one way to represent the oxygen content of a compound. Oxygen deficiency is defined with respect to the "stoichiometric" oxygen content. For example, stoichiometric $In_2O_3$ would have ~3 Oxygen atoms for every 2 Indium. A "1%" oxygen deficiency in $In_2O_3$ would therefore mean that there are roughly 2.99 oxygen atoms for every 2 Indium atoms. Even this slight difference can have a significant effect on the electronic properties of the material.

The oxygen deficiency is defined by the oxygen-to-metal ratio of the compound. Increasing the RF power puts more oxygen into the sample, and therefore decreases the deficiency. By definition, oxygen deficiency reduces the optical transparency of the film (see above). Losing transmission in transparent conducting oxides can be directly tied to oxygen deficiency. The defects or metallic states that form as a result of the oxygen deficiency participate in light absorption effects, so in a sense measuring the transparency is similar to measuring how close you are to stoichiometry.

In addition to achieving an optimal transparency, a further advantage of the present set-up and process is that the e-beam and RF-plasma-based stages can be independently carried out and/or controlled to minimize any potential damage to the perovskite in the target substrate. For instance, during the atomic oxygen generation process, electric charges in the plasma can potentially damage delicate materials like perovskites by, for example, changing a charge state of one of the species in the material. As will described in detail below, the present techniques can be implemented in a manner by which the e-beam evaporation alone is first performed to deposit a thin (e.g., from about 10 nanometers (nm) to about 20 nm thick, and ranges therebetween) layer of the TCO material on the target substrate. This thin layer will serve as a barrier layer to protect the target substrate (i.e., the perovskite) during the subsequent RF-plasma process. Specifically, following (e-beam) deposition of the TCO barrier layer, the e-beam evaporation and RF-plasma atomic oxygen generation process can then be carried out together to increase the thickness (e.g., to greater than or equal to about 120 nm, and ranges therebetween) of the TCO material on the target substrate (via the e-beam evaporation) while at the same time controlling the oxygen content in the TCO (via the RF-plasma atomic oxygen generation).

Figure 2:
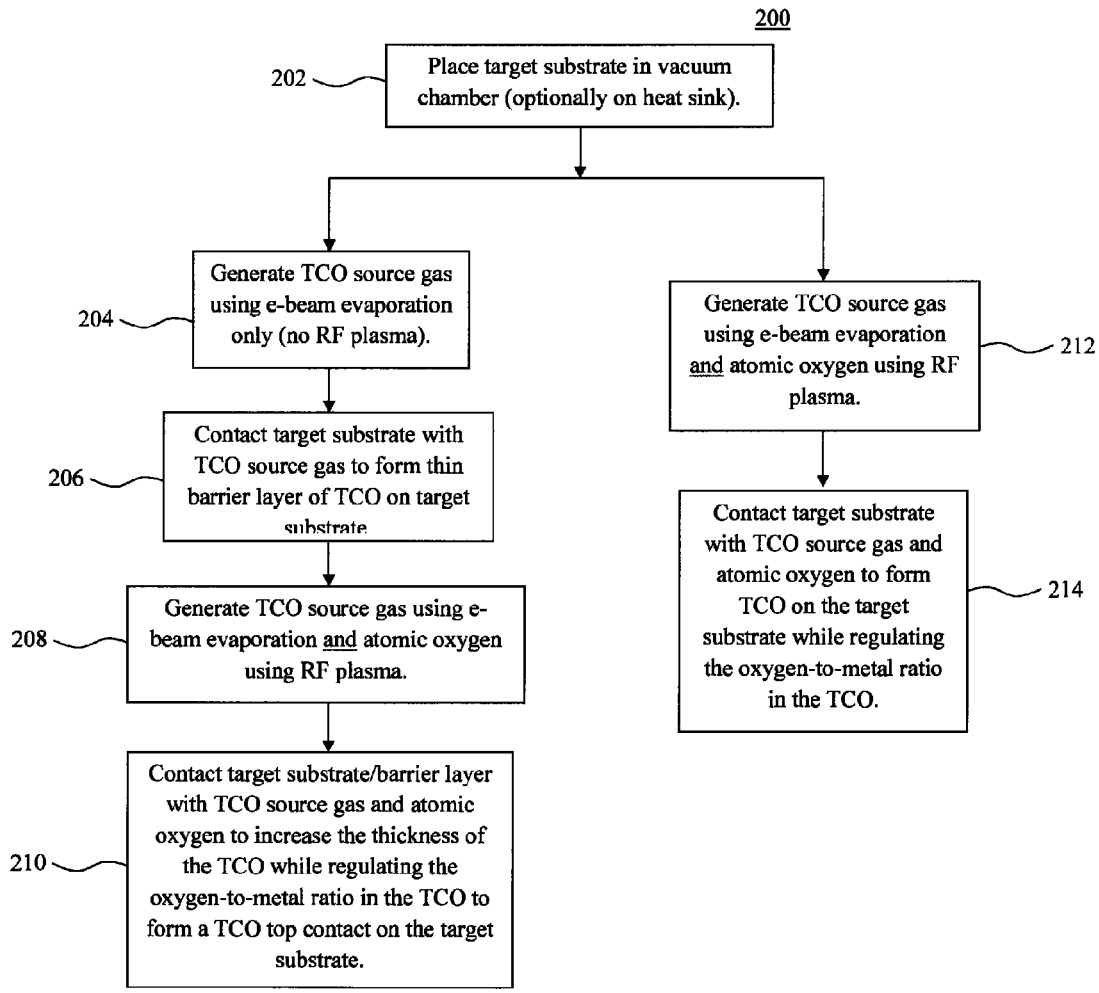
FIG. 2 is a diagram illustrating an exemplary methodology for forming a TCO top contact on a target substrate using the apparatus of FIG. 1 according to an embodiment of the present invention.

FIG. 2 is a diagram illustrating an exemplary methodology 200 for forming a TCO on a target substrate using apparatus 100. As provided above, the TCO may serve as the top contact in a perovskite-based photovoltaic device, such as a tandem photovoltaic device having a perovskite-based top cell.

In step 202, the target substrate 108 is placed in the vacuum chamber 102 of apparatus 100. As provided above, also included in the vacuum chamber 102 is an e-beam evaporation TCO (e.g., ITO, IZO, and/or TiO$_2$) source and an RF atomic oxygen source.

According to an exemplary embodiment, the target substrate is a perovskite-based solar cell on which a top transparent electrode is to be formed using the present techniques. By "perovskite-based" it is meant that the absorber of the solar cell is formed from a perovskite material. The term "perovskite," as used herein, refers to materials with a perovskite structure and the general formula ABX$_3$ (e.g., wherein A=CH$_3$NH$_3$ or NH=CHNH$_3$, B=lead (Pb) or tin (Sn), and X=chlorine (Cl) and/or bromine (Br) and/or iodine (I)). The perovskite structure is described and depicted, for example, in U.S. Pat. No. 6,429,318 B1 issued to Mitzi, entitled "Layered Organic-Inorganic Perovskites Having Metal-Deficient Inorganic Frameworks" (hereinafter "U.S. Pat. No. 6,429,318 B1"), the contents of which are incorporated by reference as if fully set forth herein. As described in U.S. Pat. No. 6,429,318 B1, perovskites generally have an ABX$_3$ structure with a three-dimensional network of corner-sharing BX$_6$ octahedra, wherein the B component is a metal cation that can adopt an octahedral coordination of X anions, and the A component is a cation located in the 12-fold coordinated holes between the BX$_6$ octahedra. The A component can be an organic or inorganic cation. See, for example, FIGS. 1a and 1b of U.S. Pat. No. 6,429,318 B1.

Figure 3:
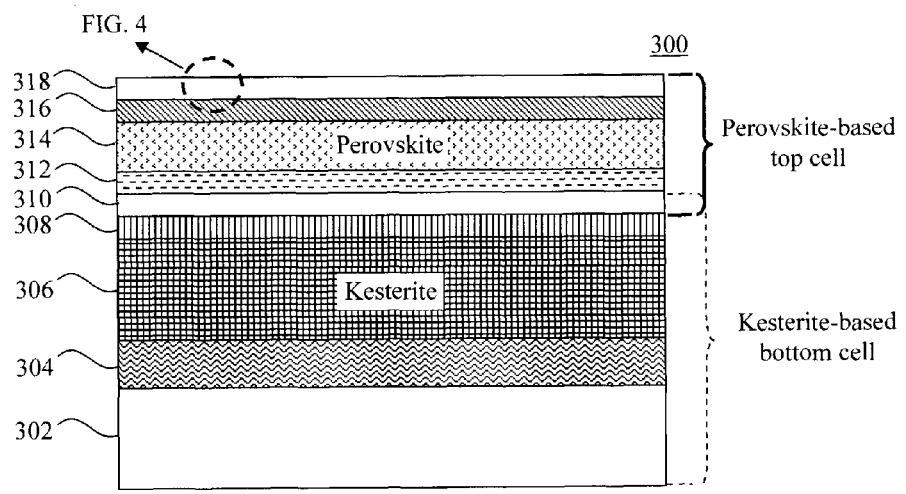
FIG. 3 is a diagram illustrating an exemplary tandem photovoltaic device having a perovskite-based top cell according to an embodiment of the present invention.

Further, according to an exemplary embodiment, the perovskite-based solar cell is part of a tandem photovoltaic device wherein the perovskite-based solar cell is a top cell in the device. An exemplary tandem photovoltaic device is shown in FIG. 3, and described below. By way of example only, a tandem photovoltaic device can include a kesterite (e.g., copper-zinc-tin-sulfur/selenium (commonly abbreviated as CZTS/Se))-based bottom cell and a perovskite-based top cell. See, for example, U.S. patent application Ser. No. 14/449,486 by Gershon et al., entitled "Tandem Kesterite-Perovskite Photovoltaic Device," (hereinafter "U.S. patent application Ser. No. 14/449,486"), the contents of which are incorporated by reference as if fully set forth herein.

As described in U.S. patent application Ser. No. 14/449,486, the bottom cell may be fabricated by first forming a CZT(S,Se) absorber layer on a suitable substrate (e.g., a substrate coated with an electrically-conductive material). A buffer layer is then formed on the absorber layer, followed by a transparent contact. In the tandem device configuration, the transparent contact can serve as both the top electrode of the CZT(S,Se) bottom cell and the bottom electrode of the perovskite-based top cell.

As described in U.S. patent application Ser. No. 14/449,486, the top cell may be fabricated on the bottom cell by first depositing a hole transporting layer on the transparent contact. Next, a perovskite absorber layer is formed on the hole transporting layer. According to an exemplary embodiment, the perovskite absorber layer is formed using the techniques described in U.S. patent Ser. No. 14/449,420 filed by Gershon et al., entitled "Techniques for Perovskite Layer Crystallization," the contents of which are incorporated by reference as if fully set forth herein which generally involves using vacuum annealing of a metal halide (e.g., lead or tin iodide, chloride or bromide) and a methylammonium halide source (e.g., methylammonium iodide, methylammonium bromide, and methylammonium chloride) to create a methylammonium halide vapor which reacts with the metal halide to form a perovskite. An electron transporting layer is then formed on the perovskite absorber layer.

To complete the top cell, a top transparent electrode will need to be formed on the electron transporting layer. This will be carried out using the present set up and techniques. For instance, the tandem device (i.e., top and bottom cells) fabricated up to the point of forming the top transparent electrode (as detailed above) serves as the target substrate 108 in the instant description. Namely, it is this structure that is placed in the vacuum chamber 102 (on the heat sink 110, if present) in step 202. It is notable, however, that the present techniques may be more broadly applicable to the use of any substrate on which the formation of a transparent contact/electrode is desired.

According to the present techniques, the formation of the top transparent electrode can be carried out in a couple of different ways. For instance, as highlighted above, in one exemplary embodiment e-beam evaporation alone (i.e., without running RF source) is first used to deposit a thin barrier layer of TCO on the target substrate 108. As described above, this initial layer of TCO will protect the target substrate 108 from damage due to the (subsequently applied) RF plasma source. The thickness of the TCO layer is then built up using e-beam evaporation along with RF-plasma atomic oxygen generation to control the oxygen content in the TCO.

Specifically, in step 204 a source gas of TCO is generated from the TCO e-beam evaporation source 104 (e.g., ITO, IZO and/or TiO$_2$) using e-beam evaporation. The details for this process were provided above. Via the present set-up, in step 206 the target substrate 108 is contacted with the TCO source gas under conditions sufficient to form a TCO barrier layer (e.g., ITO, IZO and/or TiO$_2$) on the target substrate 108.

Since no RF plasma is being used at this stage, plasma damage to the target substrate is avoided. When the RF plasma is used in subsequent stages of the process (see below), the barrier layer will protect the target substrate. Thus, it is preferable that the barrier layer formed in step 206 on the target substrate 108 is a continuous layer covering at least one surface of the target substrate 108 in its entirety. According to an exemplary embodiment, the barrier layer is formed in step 206 to a thickness of from about 10 nm to about 20 nm, and ranges therebetween. Suitable conditions for forming the barrier layer in step 206 can include a temperature of from about 10° C. to about 26° C., and ranges therebetween, a duration of from about 1 minute to about 10 minutes, and ranges therebetween, a vacuum chamber pressure of from about $1 \times 10^{-3}$ Torr to about $5 \times 10^{-5}$ Torr, and ranges therebetween. Advantageously, the low processing temperatures (which do not exceed ambient room temperature) will reduce the processing damage commonly encountered when high temperature processes, or atomic bombardment processes such as sputtering, are used along with delicate materials, such as perovskites.

For clarity, the TCO barrier layer in this embodiment may also be referred to herein as "a first TCO layer" so as to differentiate it from "a second TCO layer" which will be formed next in steps 208 and 210 to build up the TCO material on the target substrate to form the TCO top contact. As will be described in detail below, the first TCO layer and the second TCO layer can differ from one another in thickness and/or composition. Generally, however, each of these layers is formed from a TCO material and will collectively serve as a TCO top contact on the target substrate 108.

Namely, in step 208 a source gas of TCO is generated from the TCO e-beam evaporation source 104 (e.g., ITO and/or IZO) using e-beam evaporation and atomic oxygen is generated from the RF atomic oxygen source 106 (e.g., O$_2$) using RF plasma. The details for this process were provided above. Via the present set-up, in step 210 the barrier layer (i.e., first TCO layer) is contacted with the source gas of TCO and the atomic oxygen under conditions sufficient to form the second TCO layer on the first TCO layer. According to an exemplary embodiment, the second TCO layer is formed in step 210 to a thickness of from about 80 nm to about 300 nm, and ranges therebetween. Accordingly, the combined thickness of the first TCO layer and the second TCO layer (and hence the thickness of the TCO top contact) in this case would be from about 100 nm to about 320 nm, and ranges therebetween. Thus, in this example, the first TCO layer and the second TCO layer have different thicknesses.

Further, since the RF source is run only during formation of the second TCO layer, the oxygen content in the second TCO layer will differ from that in the first TCO layer. Namely, as provided above, the target oxygen deficiency in the TCO material is from about 0.5% to about 5%, and ranges therebetween so as to maximize a balance between transparency and conductivity. The as-grown material without RF plasma $O_2$ is significantly more deficient, e.g., greater than about 10% oxygen deficient. The RF plasma $O_2$ is used to add back some of the $O_2$ to get an oxygen deficiency of from about 0.5% to about 5%, and ranges therebetween in the end. It is notable that the reactive oxygen from the RF source (present during step 206) does not penetrate most of the (first) TCO layer once it has been formed. Thus, in this example, the first TCO layer and the second TCO layer have different compositions. For instance, the first (barrier) TCO layer can have a large oxygen deficiency (e.g., greater than about 10%) while the second TCO layer has an oxygen deficiency in the target range (e.g., from about 0.5% to about 5%, and ranges therebetween).

Regarding composition, it is notable that the same TCO source material may be used in steps 204 and 208, but that is not a requirement. If so desired, one may switch to a different TCO source material when forming the second TCO layer.

When the same source material is used in steps 204 and 208, it is possible to carry out steps 204 and 208 in a continuous manner, i.e., without breaking vacuum. For instance, as per step 204, e-beam evaporation alone may be used initially to deposit the TCO material on the target substrate until a layer of TCO having a thickness sufficient for the barrier layer (see above) is formed on the target substrate, at which point the RF plasma-based atomic oxygen generation process may then be run, as per step 208, (along with the e-beam evaporation) to form the second TCO layer while regulating the oxygen content in the second TCO layer.

Alternatively, different TCO source materials may be used in steps 204 and 208. For instance, the barrier layer (i.e., first TCO layer) can be formed from one material (e.g., either ITO, IZO, or $TiO_2$) and the second TCO layer from another different material (e.g., ITO if the first TCO layer is formed from IZO, IZO if the first TCO layer is formed from ITO, etc.). This may however involve breaking the vacuum and purging the vacuum chamber between steps 206 and 208, and switching the TCO source material unless, as described above, a multi-pocket e-beam evaporation system were being used, in which case two different crucibles would already be present inside of the chamber at the start of the process.

Suitable conditions for forming the second TCO layer in step 210 can include a temperature of from about 10° C. to about 26° C., and ranges therebetween, a duration of from about 1 minute to about 60 minutes, and ranges therebetween, and a vacuum chamber pressure of from about $1\times10^{-3}$ Torr to about $5\times10^{-5}$ Torr, and ranges therebetween.

Since the present process is carried out at low temperatures, the overall level of risk of damage to the absorber material is minimal. Thus, one might instead choose to forgo forming a separate barrier layer and instead run the e-beam evaporation and RF sources together in a single step, forming a single TCO layer. An advantage of this scenario is that the oxygen content can be regulated throughout the entire thickness of the TCO top contact (i.e., as provided above the reactive oxygen from the RF source does not penetrate most of the TCO layer once it has been formed).

Namely, in step 212 a source gas of TCO is generated from the TCO e-beam evaporation source 104 (e.g., ITO and/or IZO) using e-beam evaporation and atomic oxygen is generated from the RF atomic oxygen source 106 (e.g., $O_2$) using RF plasma. The details for this process were provided above. Via the present set-up, in step 214 the target substrate 108 is contacted with the source gas of TCO and the atomic oxygen under conditions sufficient to form a TCO layer on the target substrate 108 which will serve as the TCO top contact. According to an exemplary embodiment, the TCO layer is formed in step 214 to a thickness of from about 100 nm to about 120 nm, and ranges therebetween.

According to an exemplary embodiment, the present techniques are used to form a TCO top contact for a perovskite-based solar cell. The transparency of the top contact is especially important in tandem device configurations where light needs to reach the various layers of the device. Thus, for illustrative purposes only, an exemplary tandem kesterite-perovskite photovoltaic device 300 is shown in FIG. 3.

As shown in FIG. 3, the kesterite-based bottom cell in this particular, non-limiting example includes a substrate 302, a layer of an electrically conductive material 304 on the substrate 302, a kesterite absorber layer 306 on the electrically conductive material 304, a buffer layer 308 on the kesterite absorber layer 306, and a transparent contact 310 on the buffer layer 308.

By way of example only, the substrate 302 can be a transparent substrate, such as glass, quartz, or sapphire substrate. The layer of electrically conductive material 304 can be formed from a TCO, such as ITO and/or IZO. The layer of electrically conductive material 304 will serve as a bottom electrode of the kesterite-based bottom cell. The transparent contact 310 will serve as a top electrode of the kesterite-based bottom cell. Thus, the transparent contact 310 is the first layer in the perovskite-based top cell. The transparent contact 310 may also be formed from a TCO, such as ITO or IZO. It is notable that while the present techniques may be used to form the layer of electrically conductive material 304, the materials present at this stage in the process are not as sensitive to processing temperatures and, alternatively, conventional deposition techniques—such as sputtering—may be employed. By contrast, once the perovskite absorber is present in the device, the sensitivity to processing temperatures and process chemistries (e.g., contact with charged gases) vastly increases. This is why conventional processes cannot be used to demonstrate perovskite-based devices with ITO top contacts. Advantageously, the present techniques provide an effective and efficient mechanism for forming TCO materials at room temperature, thus avoiding damage from high-temperature processes.

According to an exemplary embodiment, the kesterite material contains copper (Cu), zinc (Zn), and tin (Sn), and one or more of sulfur (S) and/or selenium (Se), abbreviated herein as "CZT(S,Se)." The present techniques are not however limited to tandem device configurations with CZT (S,Se) kesterite-based bottom cells. For instance, tandem photovoltaic devices may also be fabricated in the same manner described herein based on CIGS-based bottom cells. As is known in the art, CIGS commonly refers to an alloy material containing Cu, indium (In), gallium, and one or more of S and Se. See, for example, R. F. Service, "Perovskite Solar Cells Keep On Surging," Science, volume 344, no. 6183, pg. 458 (May 2014), the contents of which are incorporated by reference as if fully set forth herein.

As shown in FIG. 3, the perovskite-based top cell includes a first carrier selective material 312 on the transparent contact 310, a perovskite absorber 314 on the first carrier selective material 312, a second carrier selective material 316 on the perovskite absorber 314, and a top contact 318 on the second carrier selective material 316. As highlighted above, top contact 318 is formed using the present low-temperature set-up/techniques so as to avoid damaging the perovskite.

By way of example only, the first carrier selective material 312 can be a hole transporting material, and the second carrier selective material 316 can be an electron transporting material. Suitable hole transporting materials include, but are not limited to, poly(3,4-ethylenedioxythiophene) (PEDOT), poly(3,4-ethylenedioxythiophene)-poly(styrenesulfonate) (PEDOT:PSS), and molybdenum trioxide ($MoO_3$). Suitable electron transporting materials include, but are not limited to, phenyl-C61-butyric acid methyl ester (PCBM), C60, and bathocuproine (BCP).

The top contact 318 is formed from a TCO, such as ITO and/or IZO. The present set-up/techniques are employed to avoid high processing temperatures in order to avoid damaging the delicate perovskite absorber 314. Further, as described above, formation of the top contact may optionally be carried out so as to first form a barrier layer (i.e., via e-beam only without running the RF plasma) that will protect the perovskite from potential plasma damage once the RF plasma atomic oxygen source is turned on. The result is the top contact being formed from at least one first TCO (barrier) layer and at least one second TCO layer, wherein the first TCO layer and the second TCO layer differ from one another in thickness, composition, etc. See, for example, FIG. 4.

Figure 4:
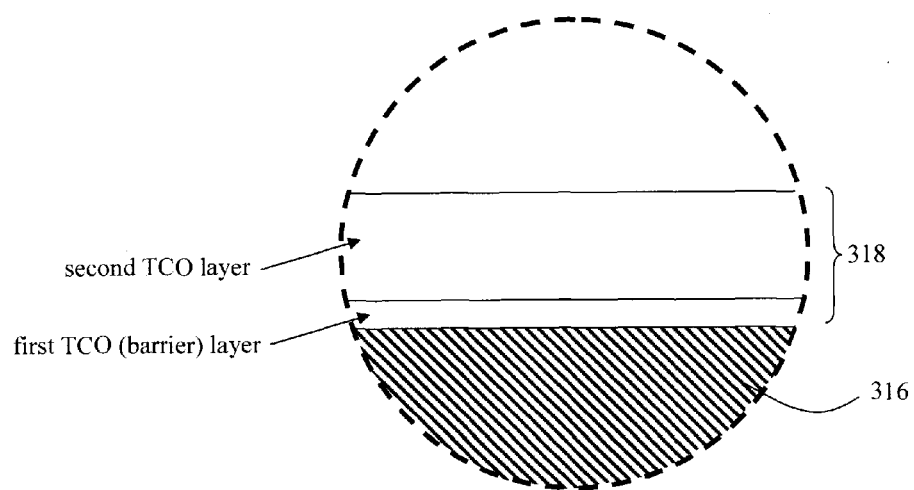
FIG. 4 is a diagram illustrating an enlarged view of a section of a top contact (of FIG. 3) in the case where a barrier layer is formed to protect the perovskite-based top cell from plasma damage according to an embodiment of the present invention.

FIG. 4 is a diagram illustrating an enlarged view of a section of the top contact 318 (of FIG. 3) in the case where a barrier layer is first formed (via e-beam evaporation only) on the second carrier selective material 316 to protect the perovskite absorber 314 from the RF plasma (used subsequently in the process to generate atomic oxygen to control the oxygen content in the TCO—see above). As shown in FIG. 4, the first TCO layer (i.e., the barrier layer) is thinner than the second TCO layer. Also, since the oxygen radicals (used only during the formation of the second TCO layer—see above) largely do not penetrate the already-formed first TCO layer, the first and second TCO layers will differ from one another in their oxygen-to-metal composition. Further, as provided above, if so desired one may vary the TCO material used to form the first TCO layer vis-à-vis that used to form the second TCO layer.

Figure 5:
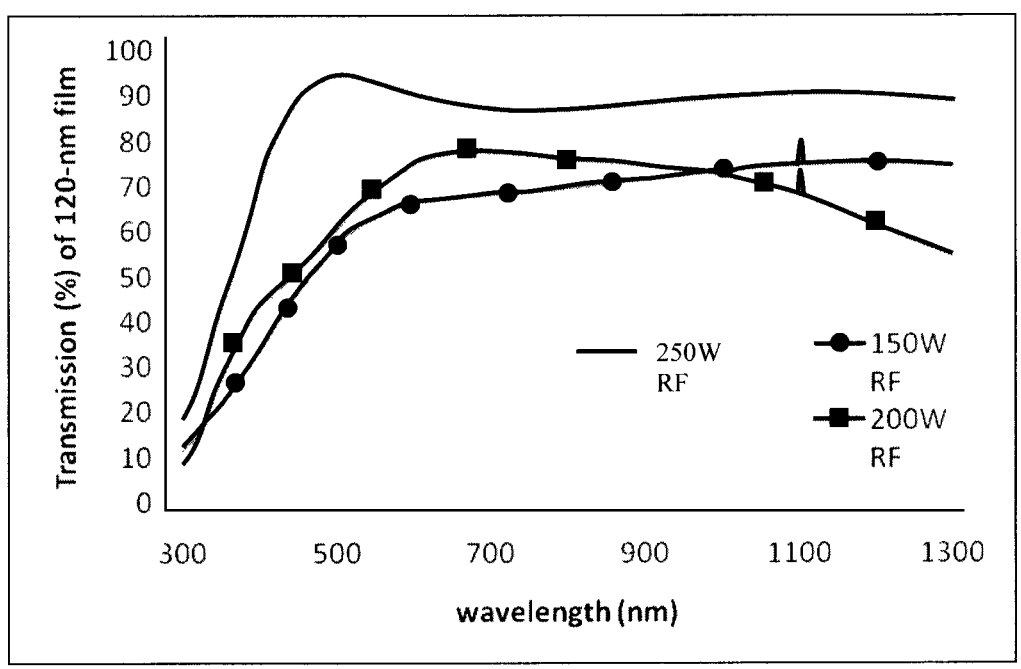
FIG. 5 is a diagram illustrating characteristics of an indium-tin-oxide (ITO) film formed using the present techniques according to an embodiment of the present invention.

By way of example only, FIG. 5 is a diagram illustrating characteristics of a 120 nm-thick ITO film ($In_2O_3$:Sn (5%)) formed using the present techniques. In FIG. 5, wavelength (measured in nm) is plotted on the x-axis and percent (%) transmission is plotted on the y-axis for samples prepared using 150 watts (W), 200 W, and 250 W of RF power. By regulating the RF power one can control the amount of oxygen atoms produced, and hence the oxygen content in the resulting TCO sample. FIG. 5 illustrates that by controlling the percentage of cracked $O_2$ (via RF power one can achieve a 90% transparency over the visible light spectrum. It was found that the samples prepared with 150 W, 200 W, and 250 W of RF power had a sheet resistance of 260 ohms per square (ohm/sq), 130 Ohm/sq, and 165 ohm/sq, respectively. Thus a sheet resistance can be achieved using the present techniques that is comparable with a sputtering process (e.g., 165 ohm/sq).

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a transparent conducting oxide (TCO) on a substrate, the method comprising the steps of:
   generating a TCO source gas using electron-beam (e-beam) evaporation;
   contacting the substrate with the TCO source gas generated using the e-beam evaporation under conditions sufficient to form a first layer of the TCO on the substrate;
   after the first layer of the TCO has been formed on the substrate, generating atomic oxygen using radio frequency (RF) plasma, wherein the first layer of the TCO serves as a barrier layer to protect the substrate from the RF plasma; and
   contacting the substrate and the first layer of the TCO with both the TCO source gas generated using the e-beam evaporation and the atomic oxygen generated using the RF plasma under conditions sufficient to form a second layer of the TCO on the first layer of the TCO.

2. The method of claim 1, further comprising the step of:
   regulating an amount of atomic oxygen generated to control an oxygen content in the second layer of the TCO.

3. The method of claim 1, wherein the first layer of the TCO has a thickness of from about 10 nm to about 20 nm, and ranges therebetween.

4. The method of claim 1, wherein the steps are carried out in a vacuum chamber.

5. The method of claim 4, further comprising the step of:
   placing the substrate on a heat sink within the vacuum chamber.

6. The method of claim 1, wherein the source gas of the TCO is generated from a TCO source material selected from the group consisting of: indium-tin-oxide (ITO), indium-zinc-oxide (IZO), and combinations thereof.

7. The method of claim 1, wherein the conditions sufficient to form the second layer of the TCO on the first layer of the TCO comprise a temperature, a duration, and a pressure.

8. The method of claim 7, wherein the temperature is from about 10° C. to about 26° C., and ranges therebetween.

9. The method of claim 7, wherein the duration is from about 1 minute to about 60 minutes, and ranges therebetween.

10. The method of claim 7, wherein the pressure is from about $1 \times 10^{-3}$ Torr to about $5 \times 10^{-5}$ Torr, and ranges therebetween.

11. The method of claim 1, wherein the TCO is formed on the substrate to a thickness of from about 100 nm to about 320 nm, and ranges therebetween.

12. The method of claim 1, wherein the substrate comprises a perovskite-based solar cell, and wherein the TCO forms a top electrode of the perovskite-based solar cell.

13. The method of claim 12, wherein the perovskite-based solar cell comprises a top cell in a tandem photovoltaic device.

14. The method of claim 1, wherein the second layer of the TCO has a different oxygen content from the first layer of the TCO.

15. The method of claim 1, wherein the conditions sufficient to form the first layer of TCO on the substrate comprise a temperature of from about 10° C. to about 26° C., and ranges therebetween, a duration of from about 1 minute to about 10 minutes, and ranges therebetween, and a pressure of from about $1\times10^{-3}$ Torr to about $5\times10^{-5}$ Torr, and ranges therebetween.

16. A method of forming a TCO on a substrate, the method comprising the steps of:

generating a first TCO source gas using e-beam evaporation;

contacting the substrate with the first TCO source gas generated using e-beam evaporation under conditions sufficient to form a first layer of the TCO on the substrate;

after the first layer of the TCO has been formed on the substrate, generating both i) atomic oxygen using RF plasma, wherein the first layer of the TCO serves as a barrier layer to protect the substrate from the RF plasma, and ii) a second TCO source gas using e-beam evaporation; and contacting the substrate and the first layer of the TCO with both the second TCO source gas generated using e-beam evaporation and the atomic oxygen generated using RF plasma under conditions sufficient to form a second layer of the TCO on the first layer of the TCO.

17. The method of claim 16, wherein the steps are carried out in a vacuum chamber, wherein the first layer of the TCO is a different TCO material from the second layer of the TCO, and wherein the vacuum chamber comprises a multi-pocket e-beam evaporation system having at least one first pocket comprising a first TCO source material that is used to generate the first TCO source gas, and at least one second pocket comprising a second TCO source material that is used to generate the second TCO source gas.

18. The method of claim 17, wherein the first layer of the TCO comprises a material selected from the group consisting of: IZO and titanium oxide, and wherein the second layer of the TCO comprises ITO.

\* \* \* \* \*